(12) United States Patent
Iacoponi

(10) Patent No.: US 6,649,533 B1
(45) Date of Patent: Nov. 18, 2003

(54) METHOD AND APPARATUS FOR FORMING AN UNDER BUMP METALLURGY LAYER

(75) Inventor: John A. Iacoponi, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/305,827

(22) Filed: May 5, 1999

(51) Int. Cl.[7] .................................. H02L 21/20
(52) U.S. Cl. ................... 438/719; 438/706; 438/723; 438/724; 438/737; 438/743; 438/744; 438/745; 438/756
(58) Field of Search ................ 438/706, 719, 438/723, 724, 737, 743, 744, 745, 756, 757

(56) References Cited

U.S. PATENT DOCUMENTS

| 5,162,257 | A | * | 11/1992 | Yung | 437/183 |
|---|---|---|---|---|---|
| 5,293,006 | A | * | 3/1994 | Yung | 174/261 |
| 5,470,787 | A | * | 11/1995 | Greer | 437/183 |
| 5,736,456 | A | * | 4/1998 | Akram | 438/614 |
| 5,767,010 | A | | 6/1998 | Mis et al. | 438/614 |
| 5,773,359 | A | | 6/1998 | Mitchell et al. | 438/614 |
| 5,785,236 | A | * | 7/1998 | Cheung et al. | 228/180.5 |
| 5,946,590 | A | * | 8/1999 | Satoh | 438/613 |
| 6,017,820 | A | * | 1/2000 | Ting et al. | 438/689 |
| 6,060,389 | A | * | 5/2000 | Brennan et al. | 438/643 |
| 6,130,141 | A | * | 10/2000 | Degani et al. | 438/455 |
| 6,388,203 | B1 | * | 5/2002 | Rinne et al. | 174/261 |

* cited by examiner

Primary Examiner—Robert Kunemund
(74) Attorney, Agent, or Firm—Mikio Ishimaru

(57) ABSTRACT

A method and an apparatus for forming an under bump metallurgy layer over a contact pad area on an interconnect formed over a semiconductor substrate are provided which eliminate a pretreatment process for removing native oxide on the contact pad area prior to the deposition of the under bump metallurgy layer. In one embodiment, the removal of a cap layer which insulates the contact pad area and the deposition of the under bump metallurgy layer are carried out without leaving a vacuum environment.

19 Claims, 3 Drawing Sheets

METHOD AND APPARATUS FOR FORMING AN UNDER BUMP METALLURGY LAYER

TECHNICAL FIELD

The present invention relates generally to electronic devices and more specifically to method and apparatus of forming interconnects for semiconductor devices.

BACKGROUND ART

Advanced semiconductor chips often use solder balls or solder bumps for electrical coupling to another semiconductor chip or to a different electronic component. The use of solder bumps requires the use of an under bump metallurgy layer to support the solder bumps, to provide a diffusion barrier, and to provide adequate adhesion between the solder bumps and a support substrate with contact pads formed thereon. Electrical coupling is made between the substrate and the solder bumps through the contact pads and the under bump metallurgy layer. For solder bumps, under bump metallurgy layer may include a metal stack formed of titanium/chromium/copper/tin, titanium tungsten/chromium/copper/gold, chromium/copper/gold, chromium/copper/tin, or the like. The contact pads are typically formed of aluminum.

In order to enhance the speed-power product of semiconductor devices, lower RC time constant technology is required. Lower RC time constant technology can be applied to the interconnect systems, which connect integrated circuit devices formed in semiconductor substrates. To lower the dielectric constant and the resistance of the interconnect systems, some technologists have proposed low dielectric constant materials and copper interconnects.

Typical low dielectric constant dielectrics are deposited by either CVD (chemical vapor deposition) or spin-on techniques. Typical low resistance metals are patterned to form interconnects using a damascene metallization process. The damascene metallization process involves patterning of trenches and forming metal interconnects. This process may require overfilling of the trenches. A polishing or etchback technique is then used to remove any excess metal outside the trenches.

In the formation of copper interconnects using a damascene metallization process, copper interconnects on the last copper layer will be exposed in the bonding pad or contact pad areas. The contact pad areas are located on the top semiconductor substrate. The contact pad areas are the regions where wires or solder bumps make contact with the contact pads to form electrical connections with the copper interconnects. Where the copper interconnects are exposed in the contact pad areas, the copper is designed to be used as an interconnect and as a contact pad. Alternatively, a separate top metal contact pad may be formed atop a copper interconnect. The sole purpose of the top metal is to cap the copper interconnect and enable the use of standard solder bump formation techniques. That top layer normally is comprised of aluminum, or some refractory metal like titanium, titanium nitride, tantalum, or tantalum nitride, or combinations of these with aluminum. Adding an additional layer which only serves the purpose of enabling the use of copper interconnects adds to the cost of manufacturing and is undesirable.

One conventional method of forming solder bumps on a semiconductor substrate with copper contact pads formed thereon is by forming a passivation or an insulating layer over the semiconductor substrate, including the contact pads. The insulating layer often consists of a first nitride layer, an oxide layer over the first nitride layer, and second nitride layer over the oxide layer. The first and the second nitride layer are typically formed of silicon nitride. The first nitride layer is also known as a cap layer. The oxide layer is typically formed of silicon dioxide.

The insulating layer is then patterned and etched using commercially available etch equipment to form openings through the insulating layer to expose the contact pads. The semiconductor substrate is then removed from the etch equipment. The semiconductor substrate may be stored temporarily in an ambient environment while waiting for the next processing step or be transported in an ambient environment to metal deposition equipment for the deposition of an under bump metallurgy layer. Since copper or copper alloy is readily oxidized even in an ambient environment, the contact pads must first be pretreated to remove any native oxide prior to the deposition of the under bump metallurgy layer. This is typically done in other etch equipment. The under bump metallurgy layer is then formed using conventional techniques, such as evaporation, sputtering, or chemical vapor deposition.

Drawbacks of using the pretreatment process step to remove native oxide on the contact pads prior to the formation of under bump metallurgy layer are that it adversely increases cycle time and process complexity and also introduces particles and defects, resulting in an increase in cost and yield loss. In a very large scale integration (VLSI) semiconductor chip, the number of contact pads could be up to 500 to 600 per semiconductor substrate. One single defect associated with even one of the contact pad would render the semiconductor chip defective. A solution, which would minimize the formation of native oxide on contact pads and eliminate the use of a pretreatment process step prior to the formation of under bump metallurgy layer, has been long sought but has eluded those skilled in the art. As the semiconductor industry is moving from aluminum to copper and other type of materials in order to obtain higher semiconductor circuit speeds, it is becoming more pressing that a solution be found.

DISCLOSURE OF THE INVENTION

The present invention provides a method for forming an under bump metallurgy layer on a contact pad of a semiconductor device.

The present invention provides a method for forming an under bump metallurgy layer on a contact pad of a semiconductor device without the use of a pretreatment process to remove native oxide on the contact pad prior to the deposition of the under bump metallurgy layer.

The present invention further provides a method for forming an under bump metallurgy layer on a contact pad of a semiconductor device by carrying out the removal of a cap layer which insulates the contact pad and the deposition of the under bump metallurgy layer without leaving a vacuum environment.

The present invention also provides a multi-chamber wafer fabrication equipment for forming an under bump metallurgy layer on a contact pad of a semiconductor device by carrying out the removal of a cap layer which insulates the contact pad and the deposition of the under bump metallurgy layer without leaving a vacuum environment.

The above and additional advantages of the present invention will become apparent to those skilled in the art from a reading of the following detailed description when taken in conjunction with the accompanying drawings.

BEST MODE FOR CARRYING OUT THE INVENTION

The present invention provides a method for forming a semiconductor device which eliminates the pretreatment process step of contact pads prior to the formation of an under bump metallurgy layer. FIGS. 1 through 5 illustrate the process step for forming a solder bump on a semiconductor substrate in accordance with the present invention. For convenience of illustration, like numerals are used in FIGS. 1 through 5 to denote like elements.

Figure 1:
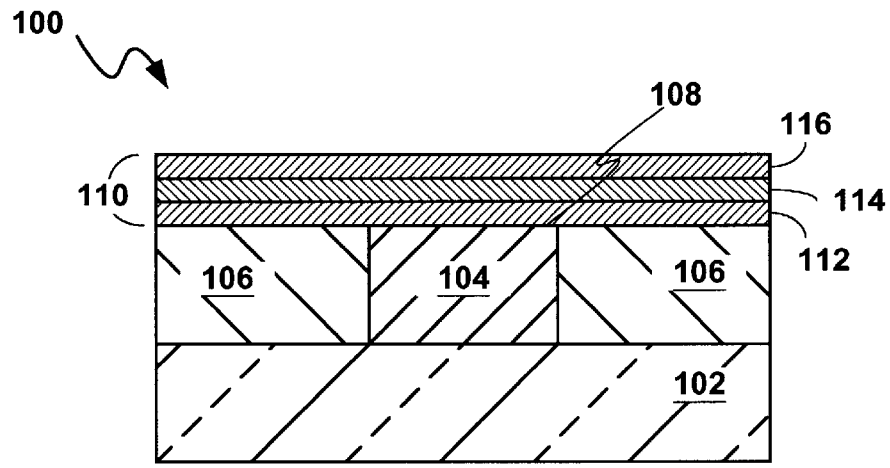
FIGS. 1 through 5 illustrate the process step for forming a solder bump on a contact pad of semiconductor substrate in accordance with the present invention.

Referring now to FIG. 1, therein is shown the cross-section of a semiconductor 100 in an intermediate stage of processing. At this stage are shown a semiconductor substrate 102 with a metal, for example, copper, interconnects 104 formed thereon. The semiconductor substrate 102 may include a multilayer interconnect structure and various doped regions separated by field oxide regions. The multilayer interconnect structure may comprise multiple levels of metal interconnects, for example, copper interconnects, 104. Each level of metal interconnects 104 is supported above the semiconductor substrate by an interlayer dielectric 106. On top of the copper interconnect 104 is a contact pad area 108. The dimensions of the contact pad area would be typically about 50–100 micron square (top view). A passivation layer 110 is formed over the contact pad area 108. The passivation layer 110 includes a first nitride insulating layer (or a cap layer) 112, an oxide insulating layer 114, and a second nitride insulating layer 116. In this preferred embodiment, the cap layer 112 is silicon nitride, the oxide layer 114 is silicon dioxide, and the second nitride layer 116 is silicon nitride.

While one copper interconnect 104 is shown, it will be readily apparent to those skilled in the art that in fact any number of such copper interconnects are formed in the interlayer dielectric 106.

Figure 2:
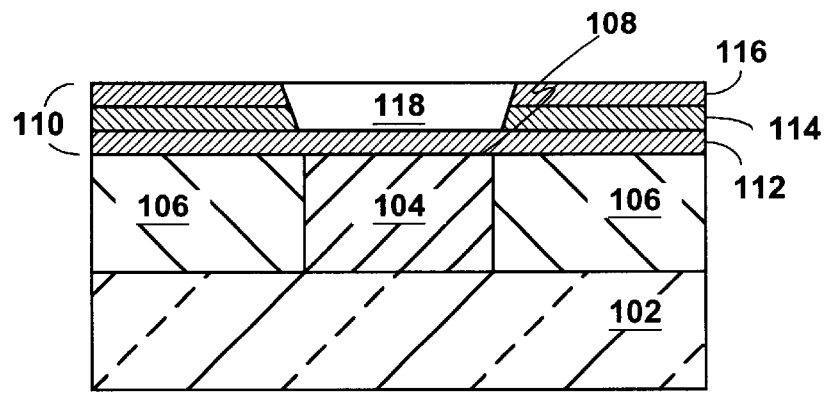

Referring now to FIG. 2, therein is shown the semiconductor substrate 102 after the conventional steps of patterning and etching of the second nitride layer 116 and the oxide layer 114 to form an opening 118 above the cap layer 112 which overlays contact pad area 108. The cap layer 112 continues to function as an insulating layer that isolates the contact pad area 108 from its surrounding environment. The cap layer 112 prevents the contact pad area 108 from oxidation even if the semiconductor substrate is subsequently exposed to an ambient environment.

Figure 3:
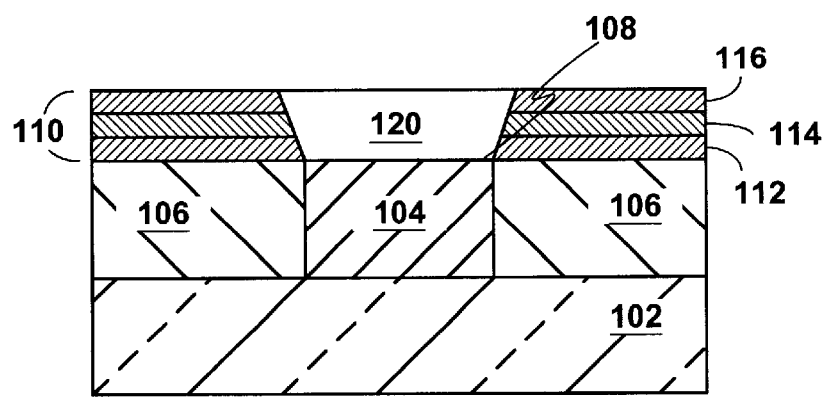

Referring now to FIG. 3, therein is shown the semiconductor substrate 102 after the conventional steps of patterning and etching (removal) of the cap layer 112 to form pad opening 120. The etching of the cap layer 112 is performed in a vacuum environment. It should be noted that the term "vacuum environment" is used herein to denote a pressure below atmospheric pressure (760 Torr) where the pressure is low enough to minimize oxidation of the contact pad area 108. For convenience, the term is also applied to an oxygen-free or non-oxidizing environment, that is, an environment in the absence of oxidizing agents such as oxygen or water.

Figure 4:
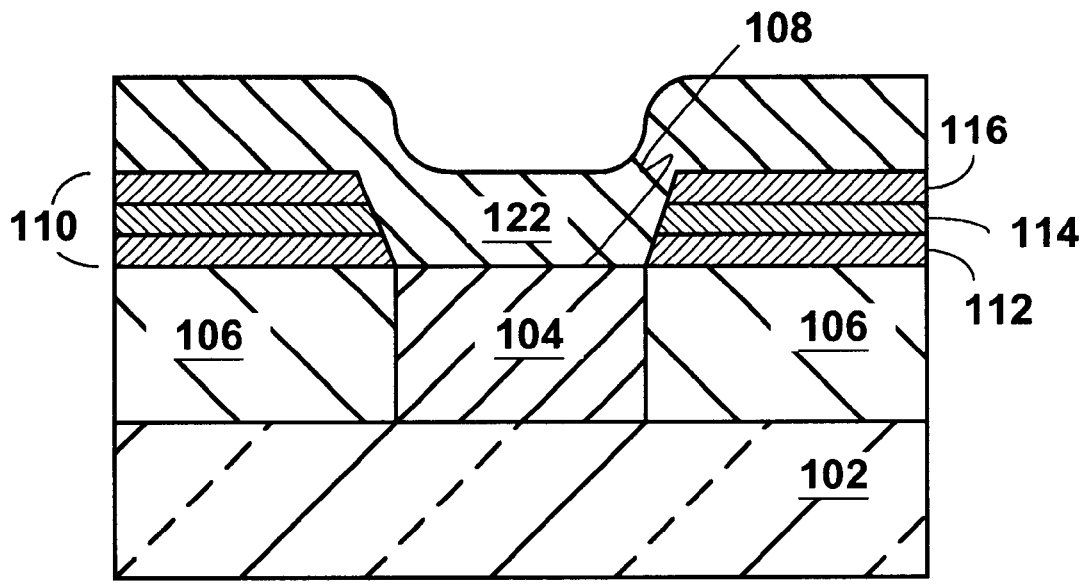

Referring now to FIG. 4, therein is shown the semiconductor substrate 102 after the deposition of an under bump metallurgy layer 122 over the semiconductor substrate 102, including the contact pad area 108. The deposition of the under bump metallurgy layer 122 is carried out in a vacuum environment. In accordance with the present invention, the etching of the cap layer 112 and the deposition of the under bump metallurgy layer 122 are carried out without leaving a vacuum environment. Since the contact pad area 108 is not exposed to an ambient environment throughout this process, the formation of native oxide on the contact pad area 108 is eliminated or minimized. Therefore, a pretreatment process for native oxide removal prior to the deposition of the under bump metallurgy layer 112 is eliminated in accordance with the present invention.

Figure 5:
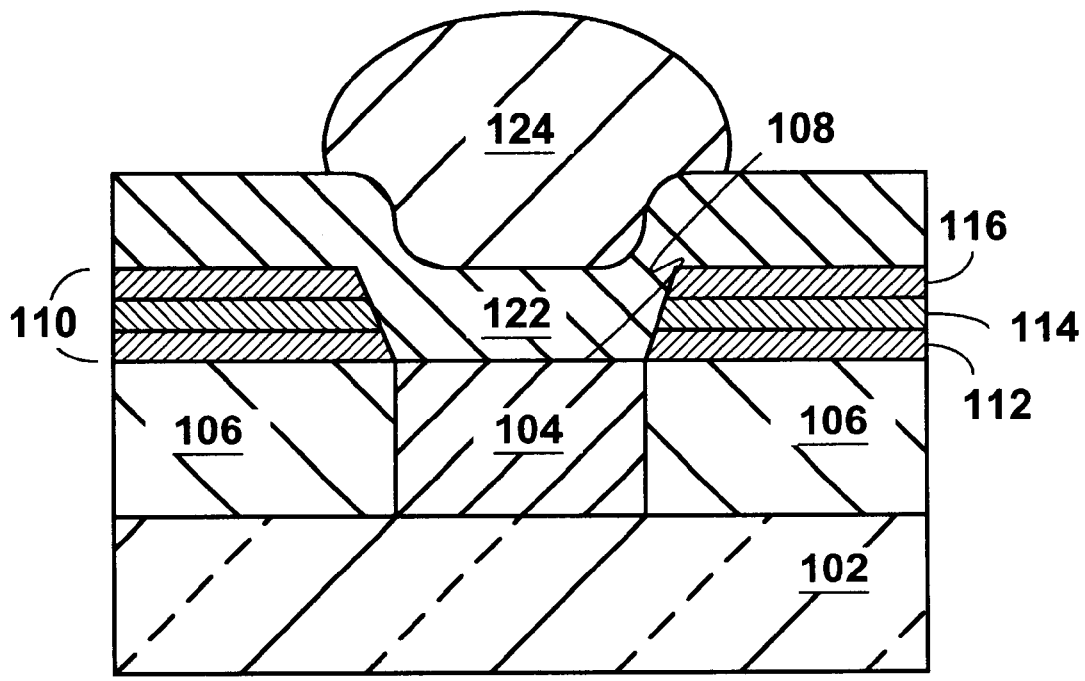

Referring now to FIG. 5, therein is shown the semiconductor substrate 102 after the conventional steps of forming a solder bump 124 over the under bump metallurgy layer 110.

Figure 6:
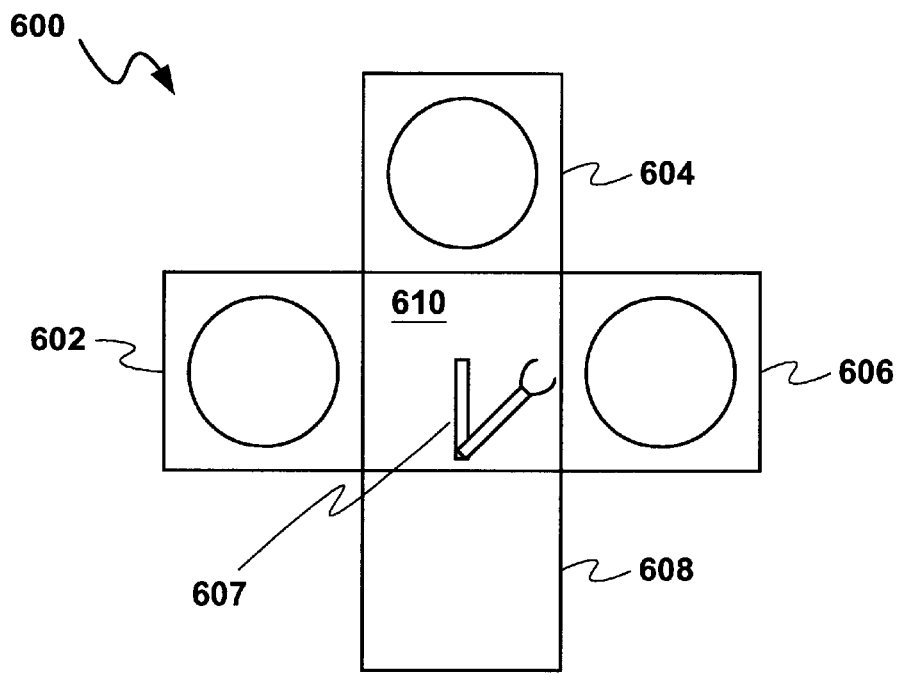
FIG. 6 (PRIOR ART) is a diagram of a conventional multi-chamber wafer fabrication equipment for carrying out the present invention.

Referring now to FIG. 6 (PRIOR ART), therein is shown a conventional multi-chamber wafer fabrication equipment 600 which can be used to practice the process in accordance with the present invention. The equipment 600 includes an etch chamber 602 for etching the cap layer 112 and removing any etch residue, and a first sputtering chamber 604 and a second sputtering chamber 606 for the deposition of the under bump metallurgy layer 122. The equipment 600 also includes a robot 607, a load lock 608 and a transfer chamber 610. The robot 607 is coupled to the transfer chamber 610. The load lock 608 is coupled to the transfer chamber 610 for receiving the semiconductor substrate 102 from an ambient environment and for allowing the robot 607 to transfer the semiconductor substrate 102 into the second transfer chamber 610. The transfer chamber 610 is also coupled to the etch chamber 602, the first sputtering chamber 604, and the second sputtering chamber 606 for allowing the robot 607 to transfer the semiconductor substrate 102 therebetween without leaving a high vacuum environment.

Figure 7:
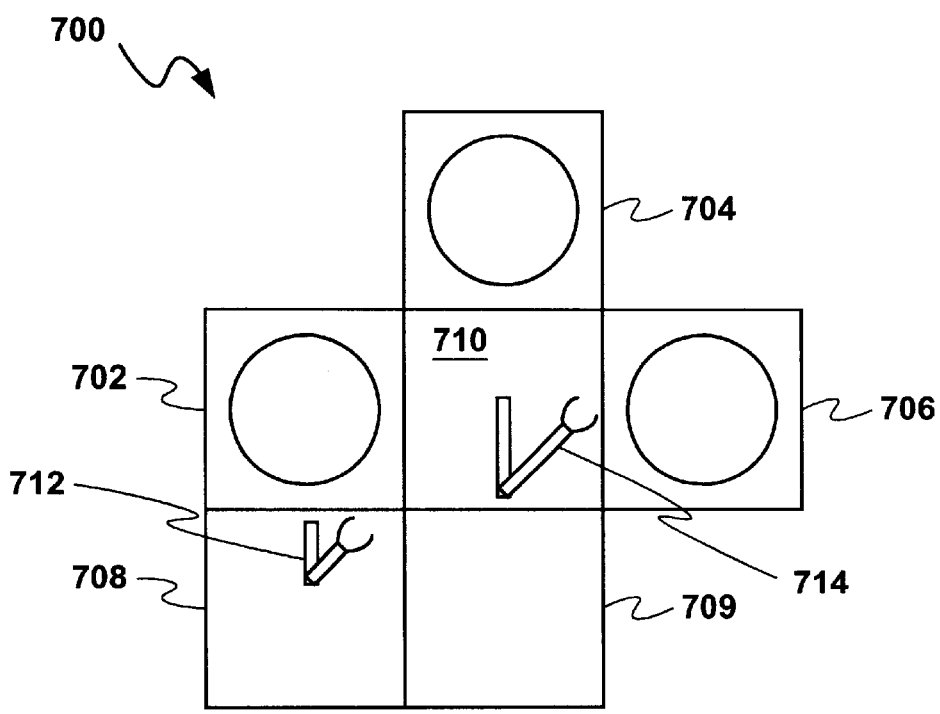
FIG. 7 is a diagram of a multi-chamber wafer fabrication equipment constructed in accordance with the present invention.

Referring now to FIG. 7, therein is shown a multi-chamber wafer fabrication equipment 700 constructed in accordance with the present invention. The equipment 700 includes an etch chamber 702 for etching the cap layer 112 and removing any etch residue, and a first sputtering chambers 704 and a second sputtering chamber 706 for the deposition of the under bump metallurgy layer 122. The equipment 700 also includes a first load lock 708, a second load lock 709, a transfer chamber 710, a first robot 712, and a second robot 714. The first robot 712 is coupled to the first load lock 708. The second robot 714 is coupled to the transfer chamber 710. The first load lock 708 is coupled to the etch chamber 702 for receiving the semiconductor substrate 102 from an ambient environment and for allowing the first robot 712 to transfer the semiconductor substrate 102 into the etch chamber 702. The transfer chamber 710 is coupled to the etch chamber 702, the first sputtering chamber 704, and the second sputtering chamber 706 for allowing the second robot 714 to transfer the semiconductor substrate 102 therebetween without leaving a high vacuum environment. After the completion of the sputtering process using either the first sputter chamber 704 and the second sputtering chamber 706, the semiconductor substrate 102 is transferred to the second load lock 709 by the second robot 714.

In production, the copper interconnect 104 is formed by a conventional damascene process or by dry etching on the semiconductor substrate 102 (FIG. 1). The conventional damascene process includes first depositing the interlayer dielectric 106 by conventional means. The interlayer dielectric 106 is typically deposited by chemical vapor deposition or spin-on techniques. The interlayer dielectric 106 is sequentially patterned and etched to form openings or trenches (not shown) therein. These trenches or trench areas are filled by blanket copper deposition to form copper interconnect 104. Polishing is employed to remove the excess copper on the top surface of the interlayer dielectric 106. Copper interconnect 104 includes the contact pad areas 108.

Next, a first nitride insulating layer (or a cap layer) 112, an oxide insulating layer 114, and a second nitride insulating layer 116 are successively formed on the semiconductor substrate 102 using conventional deposition techniques, such as chemical vapor deposition or physical vapor deposition. In this preferred embodiment, the cap layer 112 is silicon nitride, the oxide layer 114 is silicon dioxide, and the second nitride layer 116 is silicon nitride.

The next step is the patterning of the second nitride layer 116 and the oxide layer 114 with a photoresist material (not shown). Next, the patterned second nitride layer 116 and oxide layer 114 is etched to form an opening 118 above the cap layer 112 which overlays contact pad area 108 (FIG. 2). The patterning and etching steps are performed using conventional techniques. The etching stops at the cap layer 112 so that cap layer remains as an insulating layer that isolates the contact pad area 108 of the copper interconnect 104 from its surrounding environment. The cap layer 112 prevents the contact pad area 108 from oxidation even if the semiconductor substrate is subsequently exposed to an ambient environment.

The next step is the patterning and etching of the cap layer 112 to form pad opening 120 (FIG. 3). The etching of the cap layer 112 is performed in a system that has a first base pressure of less than about 1 E–5 Torr. By having a low first base pressure, oxidizing agents such as oxygen or water is eliminated from the system, and pure process gases can be introduced into the chamber. Although the actual pressure (a first operating pressure) during etching can be much higher with the introduction of pure process gases, it is considered to be in a vacuum environment because it is an environment in the absence of oxidizing agents. The first base pressure is considered to be a high vacuum environment and is low enough to minimize oxidation of the contact pad area 108.

Next, the under bump metallurgy layer 122 is formed over the semiconductor substrate 102, including the contact pad area 108. In a preferred embodiment, the under bump metallurgy layer 122 is deposited using a conventional sputtering technique with a sputtering system that has a second base pressure of less than about 1 E–5 Torr. Although the actual deposition pressure (a third operating pressure) can be much higher with the introduction of pure process gases, it is considered to be in a vacuum environment because it is an environment in the absence of oxidizing agents. Similarly, the second base pressure is considered to be a high vacuum environment and is low enough to prevent any oxidation of the contact pads. Alternatively, the under bump metallurgy may be formed by evaporation, chemical vapor deposition, or a combination of sputtering, evaporation, and chemical vapor deposition. The under bump metallurgy layer may be chromium, copper, gold, titanium, titanium tungsten, nickel, alloys thereof, compounds thereof, and a combination thereof.

The next step is the forming of the solder bump 124 over the under bump metallurgy layer 110 using conventional techniques such as electroplating.

In a preferred environment, a conventional multi-chamber wafer fabrication equipment 600 as illustrated in FIG. 6 (PRIOR ART) is used. A semiconductor substrate 102 which had been processed to a stage similar to what is shown in FIG. 2 and with a layer of patterned photoresist (not shown) formed thereon is provided to the load lock 608. The semiconductor substrates 102 is typically contained in a cassette (not shown). The load lock 608 is then pumped down from an ambient (atmospheric) pressure to a pressure that is approximately equal to the pressure of the etch chamber 602. The semiconductor substrates 102 is then transferred by the robot 607 from the load lock 608 into the etch chamber 602. After the etching process, the semiconductor substrate 102 is transferred by the robot 607 from the etch chamber 602 via the transfer chamber 610 and into the first sputtering chamber 604 for the deposition of the under bump metallurgy layer 122. The transfer chamber 610 allows the transfer of the semiconductor substrate 102 from the etch chamber 602 to the first sputtering chamber 604 without leaving a high vacuum environment. After the deposition of the under bump metallurgy layer 122, the semiconductor substrate 102 is returned to the cassette by the robot 607. The second sputtering chamber 606 allows the processing of a second semiconductor substrate 102 simultaneously for higher throughput. In a preferred embodiment, the second transfer chamber 610 has a base pressure of less than about 1 E–7 Torr. The actual pressure (a second operating pressure) during the transfer of the semiconductor substrate 102 from the etch chamber 602 to the sputtering chambers 604 and 608 is less than about 1 E–5 Torr. The second operating pressure is considered to be a high vacuum environment and is low enough to minimize oxidation of the contact pad area 108.

It should be noted that some photoresist materials continue to outgas, i.e., lose solvents or other volatile components contained therein when it is subjected to a vacuum environment. The continual outgassing of the photoresist material may cause a rise in the base pressure and/or the operating pressure of the transfer chamber. If the base pressure increases by too much, maintenance needs to be performed to restore the desired base pressure. This is undesirable because it reduces the availability of the equipment and reduces its throughput.

In another preferred embodiment, a multi-chamber wafer fabrication equipment 700 with two load locks as illustrated in FIG. 7 is used to eliminate the effect of outgassing by photoresist material. A semiconductor substrate 102 which had been processed to a stage similar to what is shown in FIG. 2 and with a layer of patterned photoresist (not shown) formed thereon is provided to the first load lock 708. The semiconductor substrate 102 is typically contained in an input cassette (not shown). The first load lock 708 is then pumped down from an ambient (atmospheric) pressure to a pressure that is approximately equal to the pressure of the etch chamber 702. The semiconductor substrates 102 is then transferred by the first robot 712 into the etch chamber 702. After the etching process, the semiconductor substrate 102 is transferred by the second robot 714 from the etch chamber 702 into the first sputtering chamber 704 for the deposition of the under bump metallurgy layer 122. The transfer chamber 710 allows the transfer of the semiconductor substrate 102 from the etch chamber 702 to the first sputtering chamber 704 without leaving a high vacuum environment. After the deposition of the under bump metallurgy layer 122, the semiconductor substrate 102 is transferred by the second robot 714 to an output cassette (not shown) located in the second load lock 709. The second sputtering chamber 706 allows the processing of a second semiconductor substrate 102 simultaneously for higher throughput. By transferring the semiconductor substrate 102 directly from the first load lock 708 into the etch chamber 702 without going through the transfer chamber 710, the photoresist outgassing problem associated with the conventional equipment is eliminated. In a preferred embodiment, the transfer chamber 710 has a base pressure of less than about 1 E–7 Torr. The actual pressure (a second operating pressure) during the transfer of the semiconductor substrate 102 from the etch chamber 702 to the sputtering chambers 704 and 708 is less than about 1 E–5 Torr. The second operating pressure is considered to be a high vacuum environment and is low enough to minimize oxidation of the contact pad area 108.

In accordance with the present invention, the removal of the cap layer 112 and the deposition of the under bump metallurgy layer 122 are carried out without leaving a vacuum environment, that is, a non-oxidizing environment, and/or an environment with a pressure low enough to minimize oxidation of the contact pad area 108. Since the contact pad area 108 is not exposed to an ambient environment or an oxidizing environment throughout this process, the formation of native oxide on the contact pad area 108 is minimized. Therefore, a pretreatment process for native oxide removal prior to the deposition of the under bump metallurgy layer 112 is eliminated in accordance with the present invention. Thus, the drawbacks associated with using the pretreatment process step to remove native oxide on the contact pad areas prior to the formation of under bump metallurgy layer are eliminated. Accordingly, the present invention advantageously reduces cycle time and process complexity and also resulting in a decrease in cost and yield loss.

While the best mode utilizes copper as examples of the interconnects material, it should be understood that the present invention is applicable to other materials such as, aluminum, doped polysilicon, gold, silver, compounds thereof, alloys thereof, and combinations thereof. In addition, the present invention is applicable to passivation layers which comprise oxynitride, such as silicon oxynitride.

As would be evident to those skilled in the art, the present invention would be applicable to forming under bump metallurgy layers in other electronic devices, such as printed circuit boards, chip-on-board, or the like.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing an electronic device, comprising the steps of:
   providing a substrate;
   forming an interconnect over said substrate, said interconnect includes a contact pad area;
   forming a first insulating layer over said contact pad area;
   forming a second insulating layer over said first insulating layer;
   patterning and removing said second insulating layer to form an opening, said opening exposes a portion of said first insulating layer overlying said contact pad area;
   removing said first insulating layer through said opening to form a pad opening in said first insulating layer above said contact pad area, said pad opening exposes a portion of said contact pad area; and
   forming an under bump metallurgy layer on said contact pad area, wherein the steps of removing said first insulating layer through said opening and forming said under bump metallurgy layer are carried out without leaving a vacuum environment.

2. The method as claimed in claim 1 wherein said substrate is a semiconductor substrate.

3. The method as claimed in claim 1 wherein said interconnect comprises a material selected from the group consisting of aluminum, copper, gold, and silver, an alloy thereof, a compound thereof, and a combination thereof.

4. The method as claimed in claim 1 wherein said first insulating layer comprises a material selected from the group consisting of a nitride, an oxide, an oxynitride, and a combination thereof.

5. The method as claimed in claim 1 wherein said first insulating layer comprises a material selected from the group consisting of silicon nitride, silicon oxide, silicon oxynitride, and a combination thereof.

6. The method as claimed in claim 1 wherein said second insulating layer comprises a material selected from the group consisting of silicon nitride, silicon oxide, silicon oxynitride, and a combination thereof.

7. The method as claimed in claim 1 wherein said under bump metallurgy layer comprises a material selected from the group consisting of chromium, copper, gold, titanium, titanium tungsten, nickel, an alloy thereof, a compound thereof, and a combination thereof.

8. The method as claimed in claim 1 wherein the step of forming said under bump metallurgy layer is done by sputtering, evaporation, chemical vapor deposition, and a combination thereof.

9. The method as claimed in claim 1, further comprising the step of providing a solder bump over said contact pad area.

10. A method of manufacturing a semiconductor device, comprising the steps of:
    providing a semiconductor substrate;
    forming an interconnect over said semiconductor substrate, said interconnect includes a contact pad area;
    forming a first insulating layer over said contact pad area, wherein said first insulating layer comprises a material selected from the group consisting of silicon nitride, silicon oxide, silicon oxynitride, and a combination thereof;
    forming a second insulating layer over said first insulating layer, wherein said second insulating layer comprises a material selected from the group consisting of silicon nitride, silicon oxide, silicon oxynitride, and a combination thereof;
    patterning and etching said second insulating layer to form an opening, said opening exposes a portion of said first insulating layer overlying said contact pad area;
    etching said first insulating layer through said opening to form a pad opening in said first insulating layer above said contact pad area, said pad opening exposes a portion of said contact pad area; and
    forming an under bump metallurgy layer on said contact pad area, wherein the steps of etching said first insulating layer through said opening and forming said under bump metallurgy layer are carried out without leaving a vacuum environment.

11. The method as claimed in claim 10 wherein said contact pad area comprises a material selected from the group consisting of aluminum, copper, gold, and silver, an alloy thereof, a compound thereof, and a combination thereof.

12. The method as claimed in claim 10 wherein said under bump metallurgy layer comprises a material selected from the group consisting of chromium, copper, gold, titanium, titanium tungsten, nickel, an alloy thereof, a compound thereof, and a combination thereof.

13. The method as claimed in claim 10 wherein the step of forming said under bump metallurgy layer is done by sputtering, evaporation, chemical vapor deposition and a combination thereof.

14. The method as claimed in claim 10 wherein said vacuum environment is at a pressure that is low enough to minimize oxidation of the contact pad area.

15. The method as claimed in claim 10, further comprising the step of providing a solder bump over said contact pad area.

16. A method of manufacturing a semiconductor device, comprising the steps of:

providing a semiconductor substrate;

forming an interconnect over said semiconductor substrate, said interconnect includes a contact pad area, wherein said contact pad area comprises a material selected from the group consisting of aluminum, copper, gold, and silver, an alloy thereof, a compound thereof, and a combination thereof;

forming a first insulating layer over said contact pad area, wherein said first insulating layer comprises a material selected from the group consisting of silicon nitride, silicon oxide, silicon oxynitride, and a combination thereof;

forming a second insulating layer over said first insulating layer, wherein said second insulating layer comprises a material selected from the group consisting of silicon nitride, silicon oxide, silicon oxynitride, and a combination thereof;

patterning and etching said second insulating layer to form an opening, said opening exposes a portion of said first insulating layer overlying said contact pad area;

etching said first insulating layer through said opening to form a pad opening in said first insulating layer above said contact pad area, said pad opening exposes a portion of said contact pad area; and forming an under bump metallurgy layer on said contact pad area, wherein the steps of etching said first insulating layer through said opening and forming said under bump metallurgy layer are carried out without leaving a vacuum environment and wherein the step of forming said under bump metallurgy layer is done by sputtering, evaporation, chemical vapor deposition and a combination thereof.

17. The method as claimed in claim 16 wherein said under bump metallurgy layer comprises a material selected from the group consisting of chromium, copper, gold, titanium, titanium tungsten, nickel, an alloy thereof, a compound thereof, and a combination thereof.

18. The method as claimed in claim 16 wherein said vacuum environment is at a pressure that is low enough to minimize oxidation of the contact pad area.

19. The method as claimed in claim 16, further comprising the step of providing a solder bump over said contact pad area.

* * * * *